(12) United States Patent
Koeda

(10) Patent No.: US 7,402,446 B2
(45) Date of Patent: Jul. 22, 2008

(54) METHOD OF MANUFACTURING AN ELECTROLUMINESCENCE DEVICE

(75) Inventor: Hiroshi Koeda, Suwa (JP)

(73) Assignee: Seiko Epson Corporation (JP)

( * ) Notice: Subject to any disclaimer, the term of this patent is extended or adjusted under 35 U.S.C. 154(b) by 87 days.

(21) Appl. No.: 10/988,418

(22) Filed: Nov. 12, 2004

(65) Prior Publication Data

US 2005/0139920 A1    Jun. 30, 2005

(30) Foreign Application Priority Data

Nov. 17, 2003   (JP) .............................. 2003-386510

(51) Int. Cl.
*H01L 21/00* (2006.01)
(52) U.S. Cl. .............................. 438/34; 438/25; 438/28; 438/110; 257/E21.122
(58) Field of Classification Search ................. 438/25, 438/28, 110, 34; 257/E21.122
See application file for complete search history.

(56) References Cited

U.S. PATENT DOCUMENTS

| | | | |
|---|---|---|---|
| 6,683,416 B1 * | 1/2004 | Oohata et al. ............. | 315/169.3 |
| 6,696,325 B1 * | 2/2004 | Tsai et al. ................... | 438/149 |
| RE38,466 E * | 3/2004 | Inoue et al. .................... | 438/30 |
| 6,919,680 B2 | 7/2005 | Shimoda | |

FOREIGN PATENT DOCUMENTS

| | | |
|---|---|---|
| JP | 10-125931 | 5/1998 |
| JP | 10-333601 | 12/1998 |
| JP | 2001-117509 | 4/2001 |
| JP | 2002-082633 | 3/2002 |
| JP | 2002-82633 | 3/2002 |
| JP | 2002-311858 | 10/2002 |
| JP | 2003-031778 | 1/2003 |
| JP | 2003-077940 | 3/2003 |
| JP | 2005-142121 | 6/2005 |

OTHER PUBLICATIONS

Communication from Japanese Patent Office regarding related application.
Communication from Chinese Patent Office regarding counterpart application.
Communication form Korean Patent Office regarding corresponding applications.

* cited by examiner

*Primary Examiner*—Howard Weiss
*Assistant Examiner*—John C Ingham
(74) *Attorney, Agent, or Firm*—Harness, Dickey & Pierce, P.L.C.

(57) ABSTRACT

A semiconductor device is provided. The semiconductor device includes an element; a mounting board; and a single film made of a conductive material directly coupling the element with the mounting board.

10 Claims, 6 Drawing Sheets

METHOD OF MANUFACTURING AN ELECTROLUMINESCENCE DEVICE

RELATED APPLICATIONS

This application claims priority to Japanese Patent Application No. 2003-386510 filed Nov. 17, 2003 which is hereby expressly incorporated by reference herein in its entirety.

BACKGROUND

1. Technical Field

The present invention relates to a semiconductor device, a method of manufacturing a semiconductor device, an electroluminescence device, and a method of manufacturing an electroluminescence device.

2. Related Art

In recent years, a method of manufacturing an electro-optical device has been developed (see Japanese Unexamined Patent Publication No. 2002-082633) as a way to join two different types of boards together to manufacture a joined board. According to this method, an electro-optical device is manufactured by joining an electro-optical board provided with a light-emitting element, such as an organic electroluminescence (EL) device, and a driving circuit board (semiconductor device) provided with a driving element that makes the light emitting element emit light.

In this method of manufacturing a joined board, an electro-optical board and a driving circuit board are separately provided and then the two boards are joined together to form an electro-optical device. Therefore, a process required for forming the driving circuit board after forming or printing a driving element, such as a thin-film transistor (TFT), can be reduced, and thereby significantly reduce the possibility of damaging the driving element during the manufacturing process. Also, since the electro-optical board and the driving circuit board are manufactured in separate steps, the yield can be increased. It is also possible to join an electro-optical board and a driving circuit board manufactured by different plants or manufacturers, which is highly advantageous in reducing manufacturing costs. Also, it is possible to manufacture a wide-screen electro-optical device with a comparatively low investment in a plant and equipment.

According to Publication No. 2002-082633, a TFT is printed and conductively coupled on a wiring board that is wired with an anisotropic conductive paste (ACP). This structure, however, may cause a defective contact between the wiring board and the TFT due to variations in the height of the bumps on the wiring board.

Also, since a narrow gap between the TFT pads may cause a short-circuit between neighboring pads with an ACP therebetween, the TFT size and the number of terminals are limited.

Furthermore, when conductive coupling the wiring board and the TFT, a load imposed on the TFT for coupling the wiring board and the TFT with the ACP is so large that a crack may develop in the TFT.

In order to address the above-mentioned problems, the present invention provides a semiconductor device, a method of manufacturing a semiconductor device, an EL device using a semiconductor device, and a method of manufacturing an EL device that can ensure a narrow pitch between the pads of semiconductor elements, e.g. the TFT, improve conductivity to the semiconductor elements, and prevent damage to the semiconductor elements.

SUMMARY

In order to address the above-mentioned problems, a semiconductor device according to the present invention includes an element, a mounting board, and a single film made of a conductive material directly coupling the element with the mounting board.

In other words, in the semiconductor device according to the present invention, the element is directly coupled to the mounting board by the single film without using an intervening layer (hereinafter "an inclusion") like an ACP. This structure improves the electrical conductivity between the element and the mounting board. Also since no inclusion like an ACP is used, neighboring coupling parts (e.g., pads) between the element and the mounting board do not short-circuit even if the gap between the coupling parts is narrow, which makes it preferable to narrow the pitch. In addition, since no ACP is used, no pressure is placed on the element to electrically couple the element and the mounting board, which prevents the element from being damaged.

Furthermore, since the element is directly coupled to the mounting board by the single film, no stuffing like pads or bumps are used for coupling unlike conventional devices. This reduces the materials and costs of coupling parts. While it takes time to stack and form such a stuffing, the single film can be formed in a short period of time, thereby improving manufacturing efficiency.

In order to provide the above-mentioned structure, it is preferable that the conductive material is aluminum.

This structure, in which aluminum with high conductivity is used as the conductive material, improves electrical conductivity between the element and the mounting board.

A method of manufacturing a semiconductor device according to the present invention includes: a first step of selecting a specific element among a plurality of elements provided on a forming board by covering part of the elements with a separation layer; a second step of providing the specific element with a wiring; and a third step of joining the forming board and a mounting board together, and separating the specific element and the wiring from the forming board to print the specific element and the wiring on the mounting board.

In other words, in the method of manufacturing a semiconductor device according to the present invention, since the specific element is provided with the wiring in the second step, there is no influence from size variations of the element, thereby further ensuring electrical coupling between the specific element and the wiring. Also, since no inclusion like an ACP is used in a coupling part between the specific element and the wiring, it is possible to make the pitch of the coupling part between the element and the wiring narrow.

Moreover, since the element and the wiring are separated from the forming board and printed on the mounting board in the third step, there is no need to apply a force (such as a pressing force) on the element. This prevents the element from being damaged.

In order to provide the above-mentioned structure, a specific thin-film transistor may be selected among a plurality of thin-film transistors provided on the forming board by using the separation layer in the first step; the specific thin-film transistor may be provided with a coupling member coupled to the mounting board in the second step; and the forming board and the mounting board may be joined together, the separation layer may be removed, the specific thin-film transistor and the coupling member may be separated from the forming board and printed on the mounting board in the third step.

With this structure, since the specific thin-film transistor is provided with the coupling member in the second step, there is no influence from size variations of the thin-film transistor, thereby further ensuring electrical coupling between the specific thin-film transistor and the coupling member. Also since no inclusion like an ACP is used in the coupling part between the specific thin-film transistor and the coupling member, it is possible to make the pitch of the coupling part between the thin-film transistor and the coupling member narrow.

Moreover, since the thin-film transistor and the coupling member are separated from the forming board and printed on the mounting board in the third step, there is no need to apply a force (e.g., a pressing force) on the thin-film transistor, which prevents the thin-film transistor from being damaged.

In order to provide the above-mentioned structure, the separation layer may be made of a soluble material.

With this structure, the element and the wiring, or the thin-film transistor and the coupling member can be separated from the forming board by melting the separation layer. Since no force is applied to the element or the thin-film transistor for melting the separation layer, damage of the element or the thin-film transistor is prevented.

In order to provide the above-mentioned structure, the soluble material may dissolve when heated.

This structure, in which the soluble material, i.e. the separation layer, dissolves when heated, further ensures that the element or the thin-film transistor are prevented from being pressed, which surely prevents damage of the element or the thin-film transistor.

In order to provide the above-mentioned structure, the soluble material may dissolve in a specific solvent.

This structure, in which the soluble material, i.e. the separation layer, dissolves in a specific solvent, further ensures that the element or the thin-film transistor are prevented from being pressed, which surely prevents the damage of the element or the thin-film transistor.

An electroluminescence device according to the present invention includes: a thin-film transistor board to which a board and a thin-film transistor are coupled; and an electroluminescence board including an electroluminescence element, and the thin-film transistor board and the electroluminescence board are electrically coupled and joined with a coupling structure of the semiconductor device according to the present invention, or of a semiconductor device manufactured by the method of manufacturing a semiconductor device according to the present invention.

Since the electroluminescence device according to the present invention is provided with the coupling structure of the semiconductor device according to the present invention, or of a semiconductor device manufactured by the method of manufacturing a semiconductor device according to the present invention, it is possible to improve the conductivity to a thin-film transistor and prevent damage of the thin-film transistor, and thereby prevent a defect of the finished electroluminescence device. In addition, since it is possible to narrow the pitch of conductive parts to the thin-film transistor, it is possible to reduce a mounting area, and thereby reduce the size of the electroluminescence device.

A method of manufacturing an electroluminescence device including a thin-film transistor board having a thin-film transistor and an electroluminescence board having an electroluminescence element according to the present invention includes forming the thin-film transistor board by using the method of manufacturing a semiconductor device according to the present invention.

Since the method of manufacturing an electroluminescence device according to the present invention uses the method of manufacturing a semiconductor device according to the present invention, it is possible to improve the conductivity to a thin-film transistor and prevent damage of the thin-film transistor, and thereby prevent a defect of the electroluminescence device.

DETAILED DESCRIPTION

An organic electroluminescence device (hereinafter called "organic EL device") and a method of manufacturing an organic EL device according to the present invention will now be described with reference to FIGS. 1 through 6.

It is understood that the scale of the members in the figures referred to in the following description is adequately changed so that they are visible.

Organic EL Device

Figure 1:
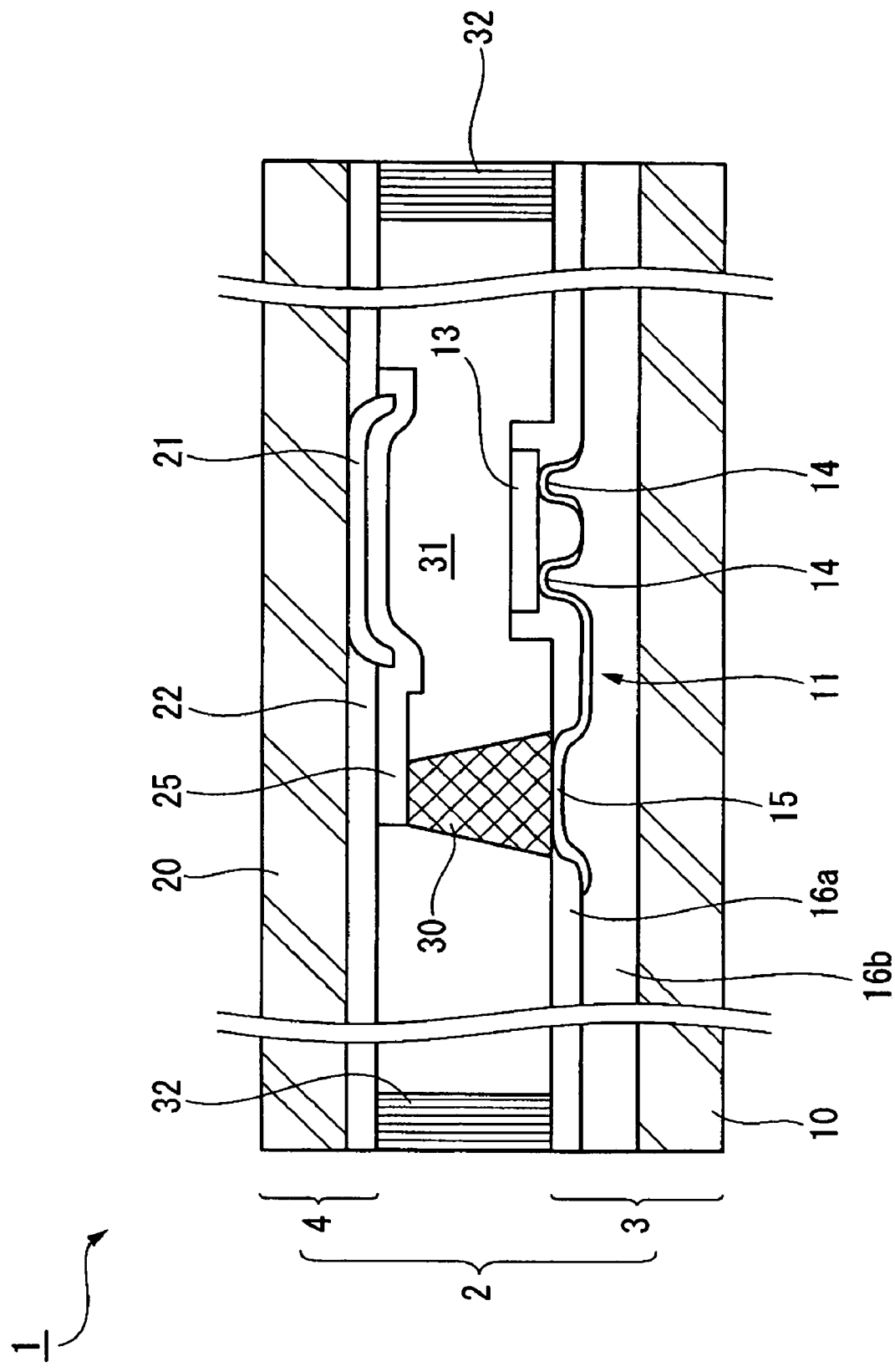
FIG. 1 is a sectional view showing major parts of an organic EL device according to the present invention.

FIG. 1 is a sectional view showing parts of an organic EL device according to the present invention.

As shown in FIG. 1, an organic EL device 1 includes at least a joined board 2. The joined board 2 includes a thin-film transistor (TFT) board 3 (semiconductor device) and an organic EL board 4, that are joined together with an inter-board conductive part 30 that will be described later therebetween.

The TFT board 3 includes a wiring board (mounting board) 10, a second interlayer insulating layer 16b, a wiring (single film, coupling member) 11, a first interlayer insulating layer 16a, and a TFT (element) 13 for driving an organic EL element 21, all of which are stacked in this order.

The wiring 11 is a single conductive layer made of a highly conductive material, such as Al. Most of the wiring 11 is arranged between the first interlayer insulating layer 16a and the second interlayer insulating layer 16b. Part of the wiring 11 is curved concavely or convexly, penetrates the first interlayer insulating layer 16a, forms a TFT coupling part 14 that directly contacts with and is electrically coupled to the TFT 13, and also forms an inter-board coupling part 15 that is electrically coupled to the organic EL element 21.

The organic EL board 4 includes a transparent board 20 through which emitted light passes, the organic EL element 21, an insulating layer 22, and a negative electrode 25.

The organic EL element 21 includes a positive electrode made of a transparent metal material such as ITO, a hole injection/transportation layer, and an organic EL element. Light is emitted when a hole produced at the positive electrode and an electron produced at the negative electrode join together at the organic EL element. Here, known methods can be used to make the detailed structure of the organic EL element. An electron injection/transportation layer may also be formed between the organic EL element 21 and the negative electrode 25.

Provided between the TFT board 3 and the organic EL board 4 are the inter-board conductive part 30 that make a conductive coupling between the inter-board coupling part 15 and the negative electrode 25, and a sealing part 32 that seals the periphery of the TFT board 3 and the organic EL board 4. A space between the TFT board 3 and the organic EL board 4 is filled with an inert gas 31.

The inter-board conductive part 30 is silver paste, and changes shape when pressed to join the TFT board 3 and the organic EL board 4 together as described later. The material of the inter-board conductive part 30 is not necessarily a paste as long as it is a conductive and flexible silver material. Also, any preferable conductive material can be used here instead of silver.

The inert gas 31 can be selected among known types of gases. Nitrogen ($N_2$) gas is used for the present embodiment. Alternatively, rare gases such as Ar are preferably used. Mixed gases can also be used as long as they are inert. The inert gas 31 is filled around a step of joining the TFT board 3 and the organic EL board 4 together as described later.

Here, a material filling the space between the TFT board 3 and the organic EL board 4 is not necessarily a gas, and an inert liquid can be used alternatively.

The sealing part 32 includes an adhesive such as a sealing resin. The sealing part 32 is provided at the periphery of the TFT board 3 and the organic EL board 4 to join the TFT board 3 and the organic EL board 4 together, and seals the space between the TFT board 3 and the organic EL board 4.

The sealing part 32 may be made of a sealing resin, or provided with a can sealing. Any other structures can be preferably adopted as long as they prevent foreign matters causing the deterioration of the organic EL element 21 from coming in. Also, an absorbent material for absorbing moisture that deteriorates the organic EL element 21 may be provided between the TFT board 3 and the organic EL board 4.

With the above-mentioned structure, the TFT 13 is directly coupled to the wiring 11 on the wiring board 10 without using an inclusion like an ACP. This improves the electrical conductivity between the TFT 13 and the wiring board 10. Also, since no inclusion like an ACP is used, neighboring coupling parts (e.g. pads) between the TFT 13 and the wiring board 10 do not short-circuit even if the gap between the coupling parts is narrow, which makes it preferable to narrow the pitch. In addition, since no ACP is used, no pressure is placed on the TFT 13 in order to electrically couple the TFT 13 and the wiring board 10, which prevents the TFT 13 from being damaged.

Furthermore, since the TFT 13 is directly coupled to the wiring 11 of the wiring board 10, the coupling parts have no stuffing like pads or bumps for coupling unlike conventional devices, and thereby reduce materials and costs of the coupling parts. While it takes time to stack and form such a stuffing, the wiring 11, which is a film, can be formed in a short period of time, and thereby improve manufacturing efficiency.

Method of Manufacturing Organic EL Device

Figure 2:
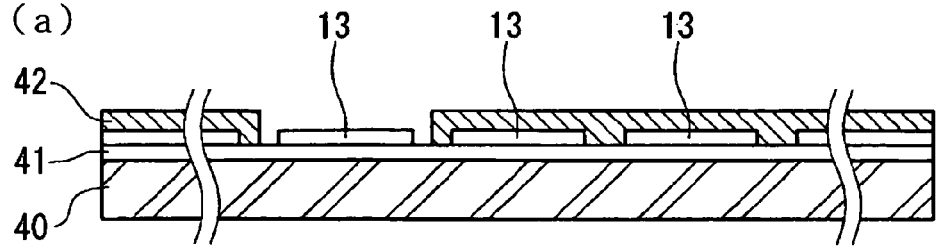
FIGS. 2A-2D are process drawings illustrating steps of manufacturing the organic EL device.
Figure 2:
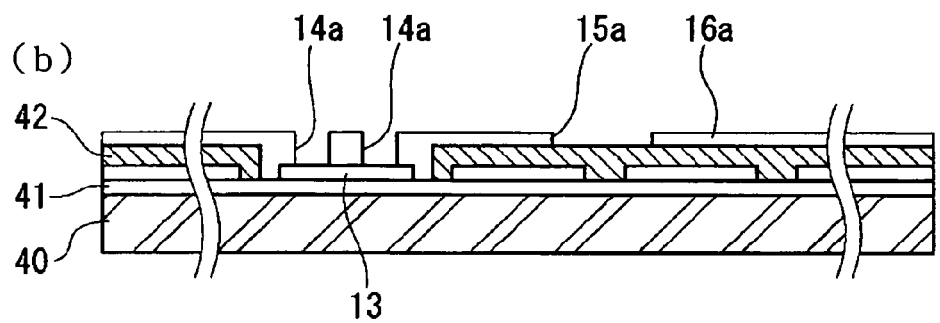
Figure 2:
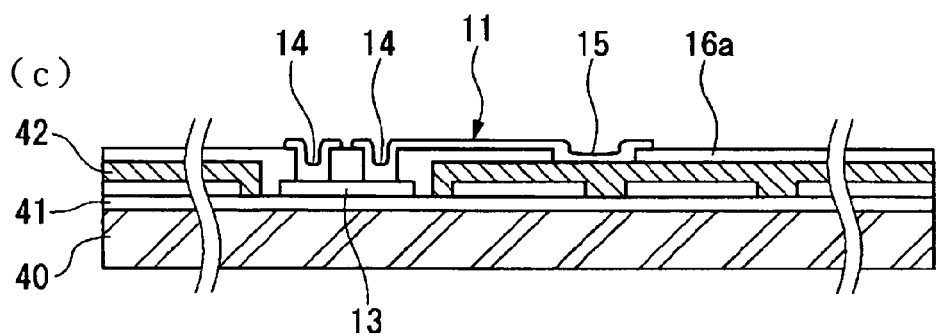
Figure 2:
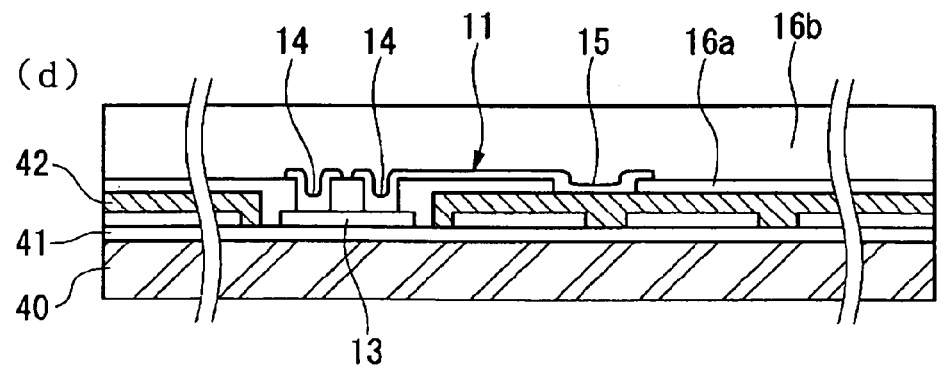
Figure 3:
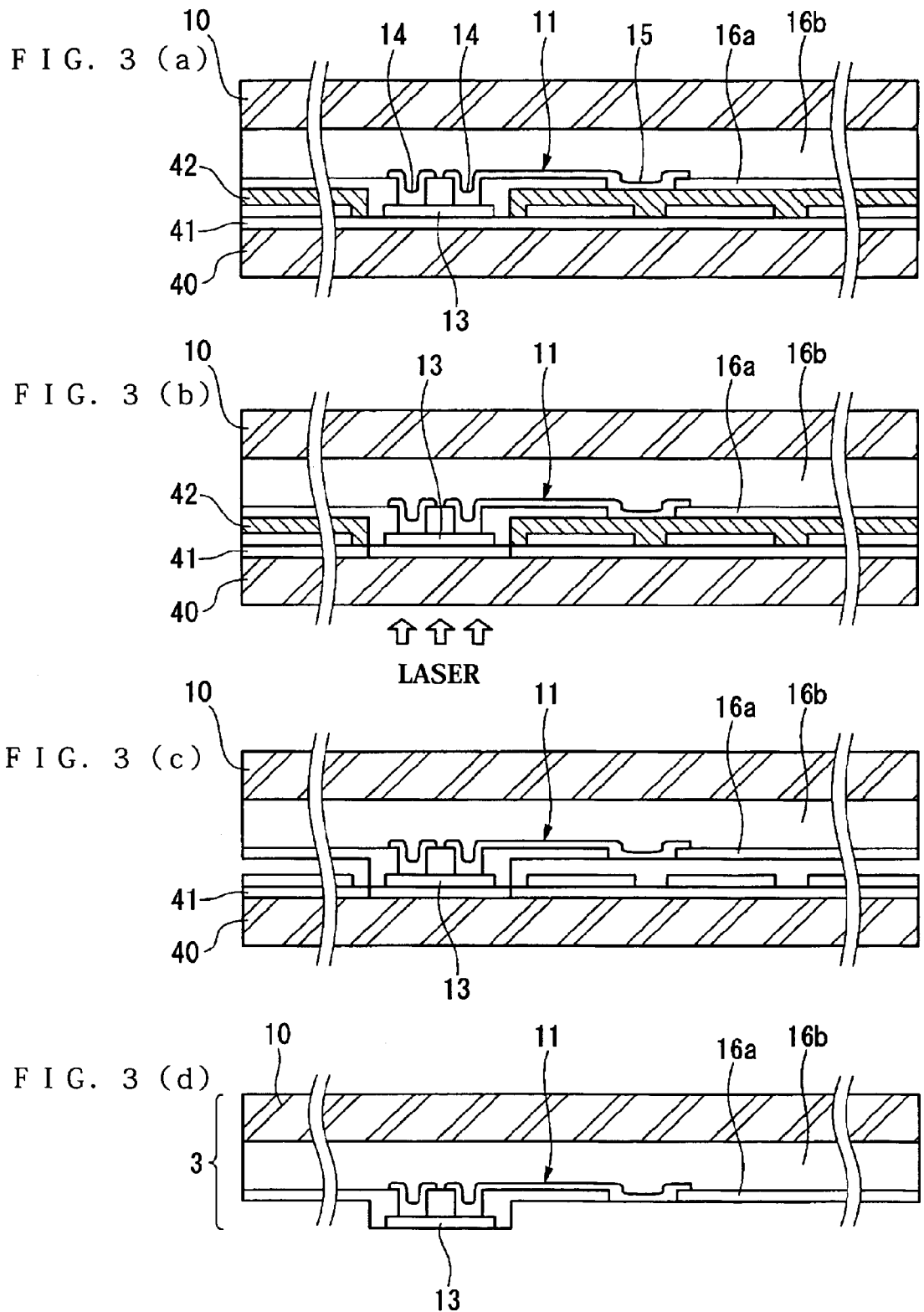
FIGS. 3A-3D are process drawings illustrating steps of manufacturing the organic EL device.
Figure 4:
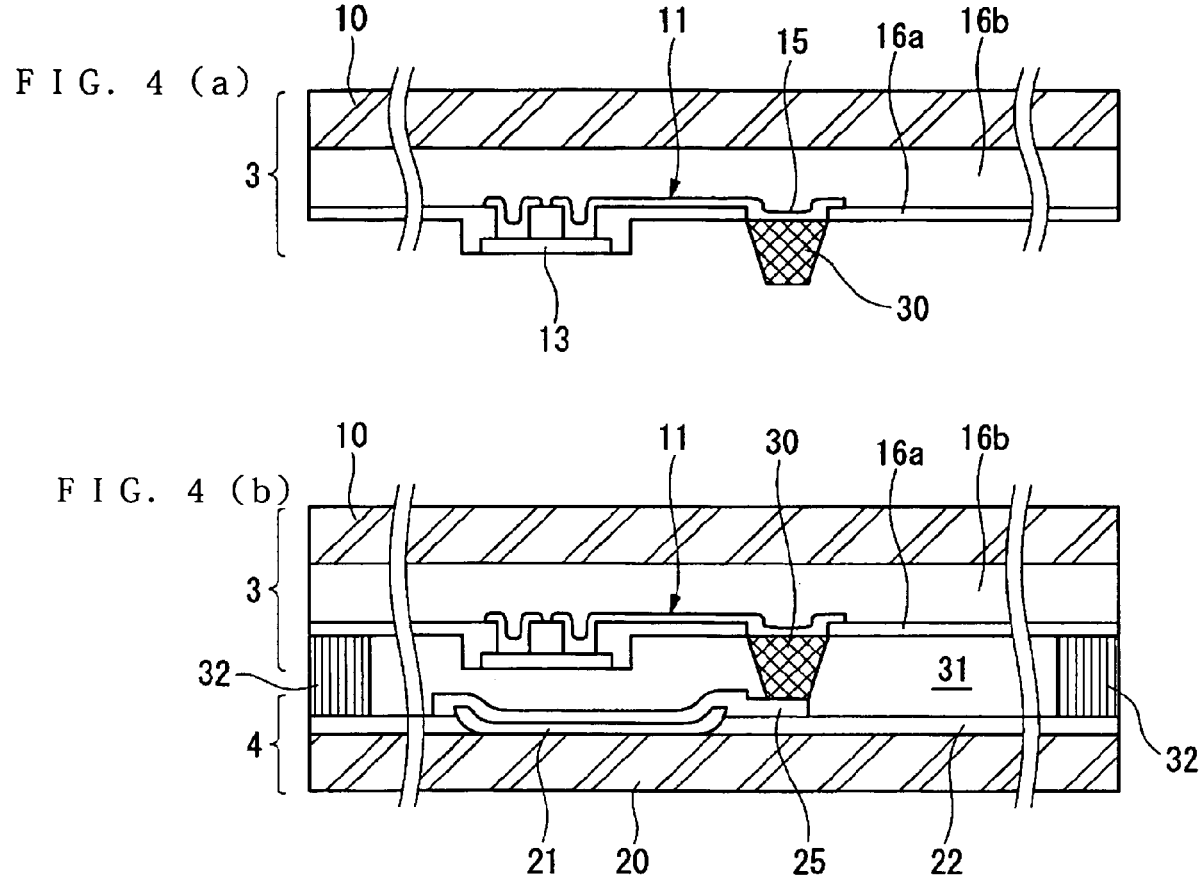
FIGS. 4A and 4B are process drawings illustrating steps of manufacturing the organic EL device.

A method of manufacturing the organic EL device 1 shown in FIG. 1 will now be described with reference to FIGS. 2 through 4. The method of manufacturing the organic EL device 1 substantially includes the steps of TFT manufacturing, TFT selection (first step), wiring (second step), TFT printing (third step), and joining a TFT board and an organic EL board together, in this order. The manufacturing steps of the organic EL device 1 may be performed in the order above, or in another adequate order. Each step that will be described below can be modified adequately.

In the present embodiment, SUFTLA (surface free technology by laser ablation, registered trademark) is used for printing the TFT etc. Other known methods can be used alternatively for printing the TFT etc.

TFT Manufacturing

Referring to FIG. 2A, the step of forming the TFT 13 on a basic board (formation board) 40 will be first described.

In this step, as shown in FIG. 2A, an amorphous Si layer 41 is provided on the basic board 40, and then a plurality of TFTs 13 is arranged and provided on the amorphous Si layer 41. In order to make it easy to select a particular TFT 13 in a later step, each TFT 13 is arranged with a given gap from an adjacent TFT.

A known method including high-temperature processing is used for manufacturing the TFT 13. Therefore, its detailed description is omitted here. The basic board 40 and the amorphous Si layer 41 will now be described in detail.

The basic board 40 is a member that is used from this step to the step of joining a TFT board and an organic EL board together, and is not an element of the organic EL device 1. More specifically, the basic board is preferably a transparent, heat-resistant board made of quartz glass etc. that withstands temperatures up to around 1,000 degrees Celsius. Other examples of appropriate materials include soda glass, Corning 7059, Nippon Electric Glass OA-2, and other heat-resistant glass.

When the amorphous Si layer 41 is irradiated with light such as laser light, separation takes place inside or on the boundary of the amorphous Si layer 41 (referred to as "inter-layer separation" or "boundary separation"). The amorphous Si layer 41 is made of amorphous silicon (a-Si) containing hydrogen (H). The contained hydrogen is turned into hydrogen gas when irradiated with laser light, causing inner pressure which promotes inter-layer separation or boundary separation inside a separation layer 2. The content of hydrogen is preferably 2 at % or more, and more preferably, from 2 to 20 at %.

The amorphous Si layer 41 possesses the action that inter-layer separation or boundary separation takes place when irradiated with light such as laser light. Instead of the above-mentioned material, others including the following materials can be used: materials in which inter-layer separation or boundary separation takes place by ablation caused by light energy; materials in which separation takes place by the action of gas generated when the material compositions are evaporated with light energy; and materials in which inter-layer separation or boundary separation takes place by the action of the material compositions that are evaporated on their own.

Examples of these materials include silicon oxide, silicate compound, silicon nitride, aluminum nitride, titanium nitride and other nitride ceramics, organic polymer materials whose interatomic bonds are broken when irradiated with light, metal materials including Al, Li, Ti, Mn, In, Sn, Y, La, Ce, Nd, Pr, Gd, and Sm, and alloys containing at least one of the metal materials.

To form the amorphous Si layer 41, chemical vapor deposition (CVD), in particular, low-pressure CVD and plasma CVD can be used.

When the amorphous Si layer 41 is made of other materials, any methods can be used as long as they provide the amorphous Si layer 41 to an even thickness, and adequately selected in accordance with the material, thickness, and other conditions of the amorphous Si layer 41. These methods include CVD (including MOCVD, low-pressure CVD, ECR-CVD), vapor deposition, molecular beam deposition (MB), sputtering, ion doping, PVD and other vapor deposition methods; electroplating, dipping, electroless plating and other plating methods; Langmuir Blodgett (LB), spin coating, spray coating, roll coating and other coating methods; printing methods, transferring methods, ink jetting, and powder jetting. Moreover, two or more of the above-mentioned methods can be used in combination. Also, when the amorphous Si layer 41 is formed by the sol-gel method using a ceramic material, or made of an organic polymer material, a coating method, in particular spin coating, is preferably used.

TFT Selection

As shown in FIG. 2A, a separation layer 42 is provided on the basic board 40, on which the TFT 13 is provided, and a particular TFT 13 is selected in this step of TFT selection.

In the step of TFT selection, first the separation layer 42 is provided on the TFT 13, patterning so that only a particular TFT 13 to be printed in a later step is exposed.

The separation layer 42 can be made of a material such as water-soluble acrylic resin that is soluble in a solvent, or wax whose melt temperature is around 100 degrees Celsius or more. When using a water-soluble acrylic material as the separation layer 42, photolithography is used for the patterning. When using wax as the separation layer 42, laser irradiation is used to evaporate the wax for the patterning.

Wiring

As shown in FIGS. 2B, 2C, and 2D, the TFT 13 that is selected is wired in the wiring step.

In the wiring step, as shown in FIG. 2B, the first interlayer insulating layer 16a made of water-resistant acrylic resin is provided on the separation layer 42. Then, a TFT coupling opening 14a and an inter-board coupling opening 15a are patterned by exposure to light with a mask or photolithography.

Subsequently, as shown in FIG. 2C, the wiring 11 is formed on the first interlayer insulating layer 16a, the TFT coupling opening 14a, and the inter-board coupling opening 15a. Then as shown in FIG. 2D, the second interlayer insulating layer 16b made of water-resistant acrylic resin is provided on the wiring 11 and the first interlayer insulating layer 16a.

Highly conductive metal materials such as Al can be used for the wiring 11. The wiring 11 can be made by vapor deposition, sputtering, or other methods. The wiring 11 made thereby is formed in a single film. The TFT coupling opening 14a is provided with the TFT coupling part 14, while the inter-board coupling opening 15a is provided with the inter-board coupling part 15. The TFT 13 and the wiring 11 are electrically coupled each other by the direct contact of the TFT coupling part 14.

TFT Printing

Referring now to FIGS. 3A, 3B, 3C and 3D, a step of forming the TFT board 3 by printing the TFT 13, the wiring 11, etc. formed on the basic board 40 on the separation layer 10 will be described.

In the step of TFT printing, the wiring board 10 is bonded on the second interlayer insulating layer 16b with an adhesive as shown in FIG. 3A. The wiring board 10 is made of glass, aramid epoxy resin whose thermal expansivity is low, or other materials.

Subsequently, as shown in FIG. 3B, the amorphous Si layer 41 that contacts with the TFT 13 that is selected in the step of TFT selection is irradiated with a laser. In the amorphous Si layer 41 that is irradiated with a layer, doped hydrogen combines to be hydrogen gas, causing inter-layer separation or boundary separation.

After the amorphous Si layer 41 is separated, the separation layer 42 is removed as shown in FIG. 3C. The method of removing the separation layer 42 depends on the material of the separation layer 42. For example, when the separation layer 42 is made of water-soluble acrylic resin, the separation layer 42 dissolves in water and is removed by dipping the basic board 40 and the wiring board 10, including the separation layer 42, in water. When the separation layer 42 is made of wax as described above, the wax is melted and removed by heating the separation layer 42 with a hot plate, a temperature controlled bath, or the like.

After the separation layer 42 is removed, as shown in FIG. 3D, the TFT 13 and the wiring 11 are separated from the basic board 40 and printed on the wiring board 10, which completes the forming of the TFT board 3.

Joining TFT Board and Organic EL Board Together

Referring now to FIGS. 4A and 4B, a step of forming the organic EL device shown in FIG. 1 by joining the TFT board 3 and the organic EL board 4 together will be described.

The organic EL board 4 shown in FIG. 4B includes the organic EL element 21, the insulating layer 22, and the negative electrode 25 that are provided on the transparent board 20 in this order.

In the step of joining the TFT board and the organic EL board together, first the inter-board conductive part 30 is provided to the wiring 11 that is exposed from the inter-board coupling opening 15a as shown in FIG. 4A. The inter-board conductive part 30 is silver paste, made by a known method such as screen printing, and changes shape when pressed to join the TFT board 3 and the organic EL board 4 together as described below. The material of the inter-board conductive part 30 is not necessarily a paste as long as it is a conductive and flexible silver material. Also, any preferable conductive materials can be used here instead of silver.

Subsequently, the organic EL board 4 is placed face to face with the TFT board 3. Both boards 3 and 4 are then joined together and pressed. The inter-board conductive part 30 contacts the negative electrode 25 and is pressed. Consequently, the inter-board conductive part 30 is crushed by the negative electrode 25, that ensures contact with the negative electrode 25 to which the inter-board conductive part 30 is electrically coupled. As a result, the TFT board 3 and the organic EL board 4 are electrically coupled with the inter-board conductive part 30 therebetween.

In this state, inert gas 31 is filled in between the TFT board 3 and the organic EL board 4. By providing the sealing part 32 for sealing the periphery of both boards 3 and 4 as shown in FIG. 4B, the organic EL device 1 is completed. The organic EL device 1 shown in FIG. 4B has the same structure as the organic EL device 1 shown in FIG. 1, while the drawings are upside down for convenience of explanation.

Here, the inert gas 31 is filled and the boards are sealed by, for example, filling the inert gas 31 after joining the TFT board 3 and the organic EL board 4 together and then sealing the boards, or joining the TFT board 3 and the organic EL board 4 together in a chamber in the presence of the inert gas and then sealing the boards.

The organic EL device 1 shown in FIG. 1, made by the above-mentioned method and including the negative electrode 25, the organic EL element, the hole injection/transportation layer, and the positive electrode on the organic EL board 4 from the TFT board 3 side, is a top-emission organic EL device that lets out emitted light from the transparent board 20 side.

With the above-mentioned structure, since a specific TFT 13 is provided with the wiring 11 etc. in the step of forming the wiring, there is no influence of size variations of the TFT 13, thereby ensuring electrical coupling between the specific TFT 13 and the wiring 11.

Also since no inclusion like an ACP is used in a coupling part between the specific TFT 13 and the wiring 11, it is possible to make the pitch of the coupling part between the TFT 13 and the wiring 11 narrow.

Moreover, since the TFT 13, the wiring 11, etc. are separated from the basic board 40 and printed on the wiring board 10 in the step of TFT printing, there is no need to apply an external force like pressing on the TFT 13, which prevents the TFT 13 from being damaged.

Since the separation layer 42 is made of a soluble material, the TFT 13, the wiring 11, etc. are separated from the basic board 40 by melting the separation layer 42 and separating the amorphous Si layer 41. Since no force is applied to the TFT 13 for melting the separation layer 42, the damage of the TFT 13 is preferably prevented.

Modification Method of Manufacturing Organic EL Device

Figure 5:
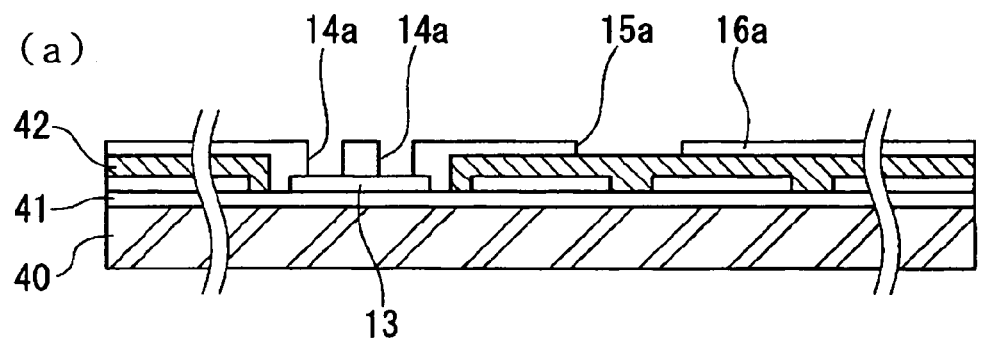
FIGS. 5A-5C are process drawings illustrating steps of manufacturing an organic EL device of a modification example according to the present invention.
Figure 5:
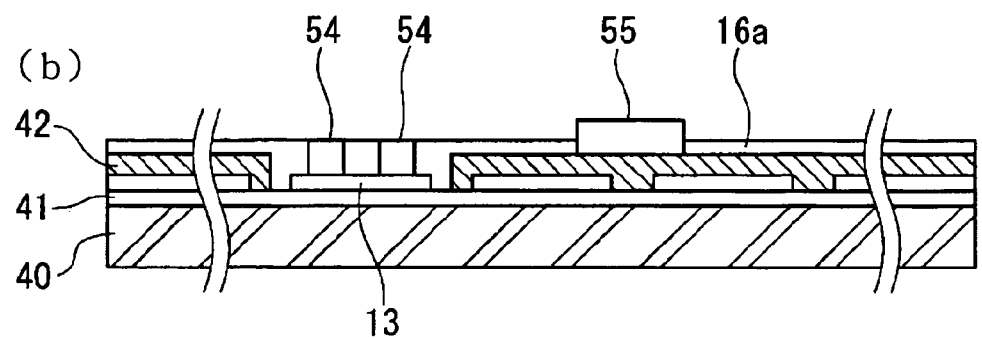
Figure 5:
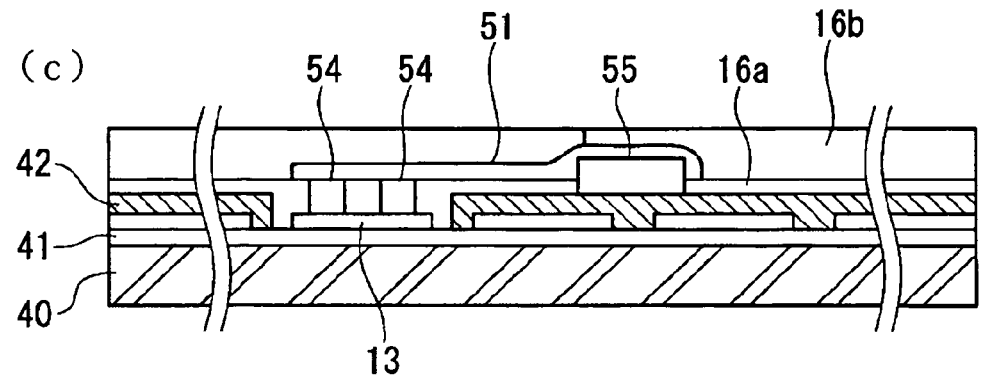
Figure 6:
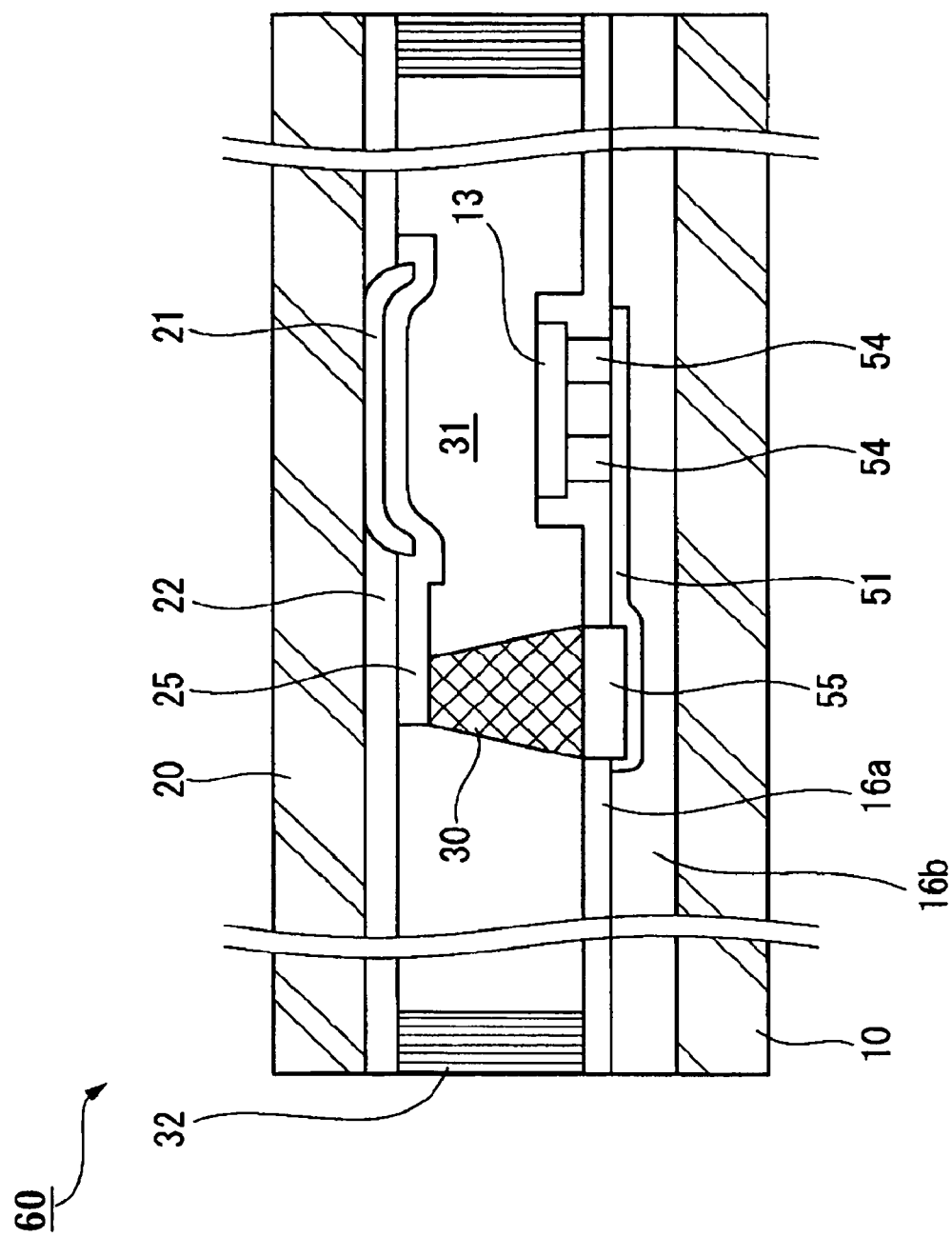
FIG. 6 is a sectional view showing major parts of the organic EL device.

Referring now to FIGS. 5 and 6, a modified example of a method of manufacturing an organic EL device will be described. While the present modification method of manufacturing an organic EL device 60 is almost the same as the method of manufacturing the organic EL device 1, the wiring steps are different. Therefore, the wiring step according to the present modified method will be described with reference to FIGS. 5 and 6, and the description of the other steps is omitted here.

Wiring

In the wiring step, as shown in FIG. 5A, the first interlayer insulating layer 16a is provided on the separation layer 42. Then, the TFT coupling opening 14a and the inter-board coupling opening 15a are patterned by exposure to light with a mask or photolithography.

Subsequently, a TFT driving electrode (coupling member) 54 and an inter-board coupling electrode 55 are provided in the TFT coupling opening 14a and the inter-board coupling opening 15a, respectively, as shown in FIG. 5B. The TFT driving electrode 54 and the inter-board coupling electrode 55 can be made of metal, such as Al, Ni, and Au. Vapor deposition and sputtering can be used when using Al for forming the TFT driving electrode 54 and the inter-board coupling electrode 55, while electroless plating can be used when using Ni or Au for forming the TFT driving electrode 54 and the inter-board coupling electrode 55.

Then as shown in FIG. 5C, a wiring 51 is provided on the first interlayer insulating layer 16a, the TFT driving electrode 54 and the inter-board coupling electrode 55. A thin Al film can be used for the wiring 51. The wiring 51 can be made by vapor deposition, sputtering, or other methods. After forming the wiring 51, the second interlayer insulating layer 16b is provided on the wiring 51 and the first interlayer insulating layer 16a.

With this method, the wiring 51 is electrically coupled to the TFT 13 with the TFT driving electrode 54 therebetween, without using an ACP or the like.

The first interlayer insulating layer 16a and the second interlayer insulating layer 16b are preferably made of water-resistant acrylic resin, and can be formed as highly flat interlayer insulating layers by employing liquid-phase methods such as spin coating.

Here, examples of materials of the wiring 11, the TFT driving electrode 54 and the inter-board coupling electrode 55 may include various conductive materials, such as metal materials, as well as the above-mentioned materials.

The wiring step is followed by the steps of TFT printing and of joining the TFT board and the organic EL board together like the method of manufacturing the organic EL device 1. Thus the organic EL device 60 of the present modification is completed (see FIG. 6).

The above-mentioned structure makes it possible to ensure electrical coupling of the wiring 11, the TFT driving electrode 54, and the inter-board coupling electrode 55 without placing a conductive member such as an ACP and solder joints in their coupling parts. It is also possible to provide electrical coupling by Al when Al is used for forming the wiring 11, the TFT driving electrode 54, and the inter-board coupling electrode 55.

It should be understood that the technical scope of the present invention is not limited to the above-mentioned embodiments and applies to various modifications without departing from the spirit and scope of the present invention.

For example, while an organic EL board having an organic EL element is used as an electro-optical board in the present embodiment, this is not intended to limit the present invention. An electro-optical board having a solid-state light-emitting element such as an LED and an FED, and a porous silicon element that emits light, can be used instead.

What is claimed is:

1. A method of manufacturing a semiconductor device, comprising:
    a first step of selecting a specific element among a plurality of elements provided on a forming board by covering non-selected elements with a separation layer;
    a second step of providing a wiring formed on the separation layer and electrically connected the specific element to the wiring, wherein the second step is performed after the first step and the separation layer is formed between the wiring layer and at least one of the elements;
    a third step of joining the forming board and a mounting board together, including printing the specific element and the wiring on the mounting board and bonding the mounting board to an insulating layer;
    a fourth step of irradiating an amorphous layer on said forming board and removing the separation layer from the semiconductor device;
    a fifth step of removing the forming board including the non-selected elements from the mounting board;
    a sixth step of electrically connecting an inter-board conductive part to the wiring; and
    a seventh step of joining the mounting board to an electroluminescence board including electrically connecting the inter-board conductive part to a negative electrode of an electroluminescence element.

2. The method of manufacturing a semiconductor device according to claim 1,
    wherein a specific thin-film transistor is selected among a plurality of thin-film transistors provided on the forming board by using the separation layer in the first step; and
    the specific thin-film transistor is provided with a coupling member in the second step to be coupled to the mounting board in the third step.

3. The method of manufacturing a semiconductor device according to claim 1, wherein the separation layer comprises a soluble material.

4. The method of manufacturing a semiconductor device according to claim 3, wherein the soluble material dissolves when heated.

5. The method of manufacturing a semiconductor device according to claim 3, wherein the soluble material dissolves in a specific solvent.

6. The method of claim 1 further comprising forming the insulating layer on the separation layer in the second step.

7. The method of claim 6 wherein the insulating layer includes openings in positions corresponding to desired wiring locations.

8. The method of claim 7 wherein the wiring is formed in the openings.

9. The method of claim 1 wherein the wiring is formed in an opening of the separation layer that corresponds to the specific element.

10. A method of manufacturing an electroluminescence device including a thin-film transistor board having a thin-film transistor and an electroluminescence board having an electroluminescence element, comprising:

forming the thin-film transistor board by using a method of manufacturing a semiconductor device including:

a first step of selecting a specific element among a plurality of elements provided on a forming board by covering non-selected elements with a separation layer;

a second step of providing a wiring formed on the separation layer and electrically connecting the specific element to the wiring, wherein the second step is performed after the first step and the separation layer is formed between the wiring layer and at least one of the elements;

a third step of joining the forming board and a mounting board together, including printing the specific element and the wiring on the mounting board and bonding the mounting board to an insulating layer;

a fourth step of irradiating an amorphous layer on said forming board and removing the separation layer from the semiconductor devise;

a fifth step of removing the forming board including the non-selected elements from the mounting board;

a sixth step of electrically connecting an inter-board conductive part to the wiring; and a seventh step of joining the mounting board to an electroluminescence board including electrically connecting the inter-board conductive part to a negative electrode of an electroluminescence element.

* * * * *